United States Patent

Tanaka et al.

[11] Patent Number: 6,011,303
[45] Date of Patent: Jan. 4, 2000

[54] ELECTRONIC COMPONENT

[75] Inventors: Junichi Tanaka; Seiji Ichikawa; Tomoaki Hirokawa; Tomoaki Kimura; Taku Sato; Kenji Watanabe; Kenji Utida; Masatoshi Ohara; Takeo Ogihara; Satoshi Murata; Tsutomu Kubota, all of Tokyo, Japan

[73] Assignee: NEC Corporation, Tokyo, Japan

[21] Appl. No.: 08/978,648

[22] Filed: Nov. 26, 1997

[30] Foreign Application Priority Data

Nov. 29, 1996 [JP] Japan .................................. 8-319691

[51] Int. Cl.⁷ .................................................. H01L 23/48
[52] U.S. Cl. ......................... 257/692; 257/698; 257/704
[58] Field of Search ................................... 257/692, 693, 257/695, 696, 704, 698

[56] References Cited

U.S. PATENT DOCUMENTS

| | | | |
|---|---|---|---|
| 3,683,241 | 8/1972 | Duncan | 317/234 |
| 5,387,814 | 2/1995 | Baudouin et al. | 257/690 |
| 5,541,451 | 7/1996 | Kusumi | 257/704 |
| 5,574,314 | 11/1996 | Okada et al. | 257/728 |

FOREIGN PATENT DOCUMENTS

| | | |
|---|---|---|
| 55-99755 | 7/1980 | Japan . |
| 59-10244 | 1/1984 | Japan . |
| 61-237458 | 10/1986 | Japan . |
| 2-14555 | 1/1990 | Japan . |
| 2-23458 | 1/1990 | Japan . |
| 2-78262 | 3/1990 | Japan . |
| 5-226548 | 9/1993 | Japan . |
| 8-78561 | 3/1996 | Japan . |

*Primary Examiner*—Olik Chaudhuri
*Assistant Examiner*—Douglas A. Wille
*Attorney, Agent, or Firm*—Young & Thompson

[57] ABSTRACT

An electronic component includes a substrate portion, a bank portion, a plurality of lead members, an anchor hole, and at least a pair of notches. A chip is supported on the substrate portion. The bank portion is formed on a periphery of the substrate portion to surround the chip. The plurality of lead members are made of conductive strip pieces, and each lead member has an inner lead electrically connected to the chip and an outer lead extending to an outside. The substrate portion and the bank portion are integrally molded with a resin to include the lead members, so that the inner and outer leads are fixed to a connecting portion between the substrate portion and the bank portion. The anchor hole is formed in a portion where each of the lead members is in contact with the bank portion, and is filled with a resin. The pair of notches are formed in two ends of each of the lead members to sandwich the anchor hole.

20 Claims, 8 Drawing Sheets

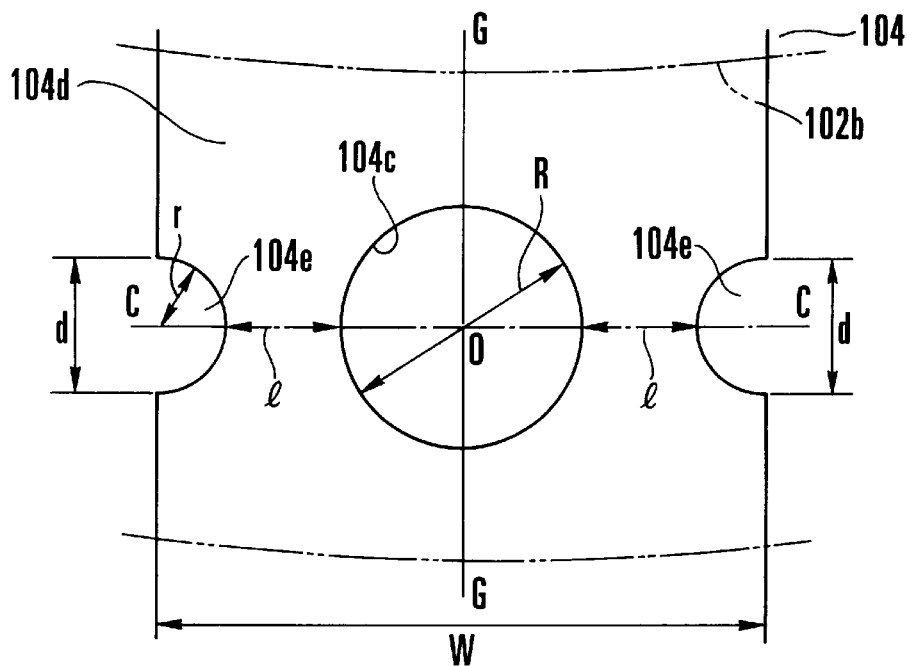
F I G. 2
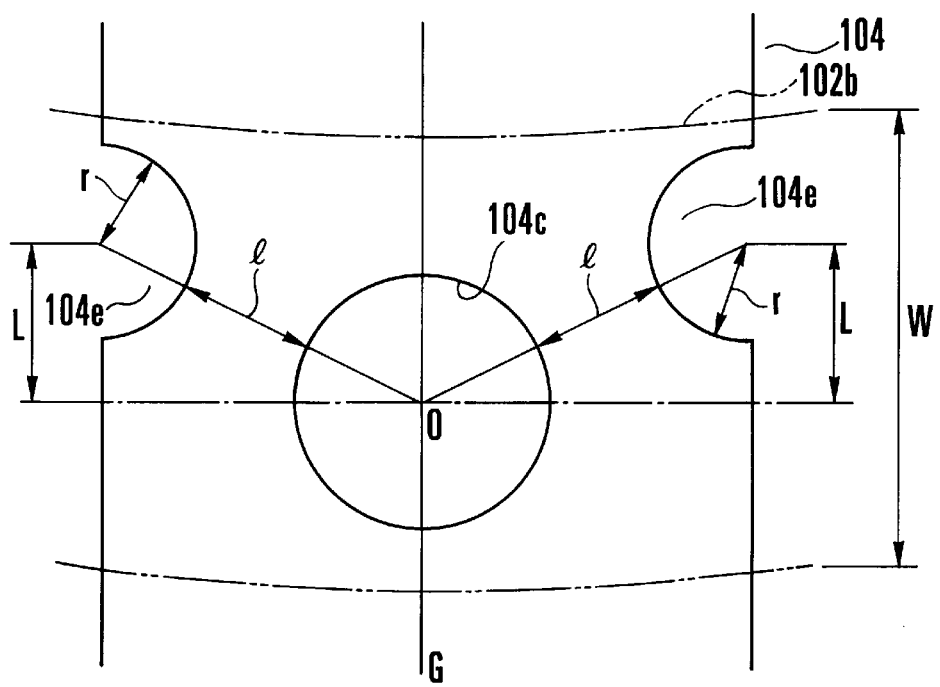
F I G. 3

ELECTRONIC COMPONENT

BACKGROUND OF THE INVENTION

The present invention relates to an electronic component formed by mounting an ultra high frequency device in a compact, hollow package and, more particularly, to the shape of a lead member into which the solder is difficult to penetrate.

Examples of the ultra high frequency device are a transistor, an IC, an optical element, a surface acoustic wave element, and a resonator. These devices are used in commercial communication equipments and satellites, and must have a high reliability and a long service life even if they may be somewhat expensive. Accordingly, such a device is conventionally incorporated in a ceramic hollow package.

In recent years, many ultra high frequency devices are used in a home-use equipment, e.g., the receiver of satellite broadcast or a portable telephone as well. Although a device used in the home-use equipment need not have such a high reliability and a long service like those in the commercial communication equipment, it must be manufactured at a low cost, which is the major issue. As the equipment is made compact, as in the case of the portable telephone, the outer shape of its ultra high frequency device must accordingly be made more compact than ever before.

Recently, a device, which has conventionally been incorporated in a ceramic hollow package, tends to be incorporated in a resin-molded package for the purpose of cost reduction. When, however, the ultra high frequency chip is entirely sealed with a resin, the parasitic capacitance increase because the resin has a high dielectric constant, leading to a large high-frequency loss.

FIGS. 7, 8A, and 8B show an electronic component formed by mounting an ultra high frequency device chip (to be merely referred to as a chip hereinafter) in a conventional hollow package. FIG. 7 shows a state wherein the cap is removed, FIG. 8A shows a state wherein the cap is placed, and FIG. 8B shows a section of FIG. 7.

Referring to FIG. 7, an electronic component 20 is constituted by an octagonal base 2 on which lead members 4 and 5 made of conductive strip pieces and arranged crosswise are sealed with a resin, a cap 8 (FIG. 8A) adhered to the base 2, a chip 3 mounted on an island 5a, and bonding wires 6 for electrically connecting the chip 3 and lead members 4 and 5 to each other. The lead members 4 and 5 and the island 5a constitute a lead frame. The cap 8 is adhered to the base 2, thereby constituting a hollow package in which a space is formed between the chip 3 and cap 8.

The base 2 is integrally molded with the lead members 4 and 5 by loading the lead members 4 and 5, before the chip is mounted on them, in a sealing mold, and injecting an epoxy resin in the sealing mold and solidifying the epoxy resin. The main body of the base 2 forms a bottomed cylinder consisting of a substrate portion 2a and an annular bank portion 2b. The lead members 4 and 5 are fixed to the chip support surface of the substrate portion 2a. The bank portion 2b is annularly formed on the periphery of the substrate portion 2a to surround the chip support surface like a frame. The bank portion 2b functions such that, even if a mechanical stress is applied to the base 2, the resin will not peel off from the lead members 4 and 5.

The lead members 4 and 5 are fixed between the substrate portion 2a and bank portion 2b, and their portions where they are in contact with the bank portion 2b are called bank portion leads 4d and 5d (indicated by crosshatched lines in FIG. 7). One surface of the island 5a constituted by the inner lead of the lead member 5, and one surface of an inner lead 4a of each lead member 4 are exposed to the inner bottom surface of the base 2, i.e., to the chip support surface of the substrate portion 2a, and outer leads 4b and 5b extend from the base 2 outwardly in four directions.

The cap 8 is molded by injecting an epoxy resin in a sealing mold and solidifying the epoxy resin. This cap 8 has a recessed portion 8a to oppose the base 2, and the periphery of the recessed portion 8a is adhered to the upper surface of the bank portion 2b with an adhesive 9, as shown in FIG. 8A.

The characteristic feature of this high frequency hollow package resides in that its outer shape is very small. For example, an outer diameter D of the package is 2 mm, a width W of the lead members 4 and 5 is 0.5 mm, and the width of the bank portion 2b is 0.35 mm. Since the outer shape of the hollow package is very small in this manner, the shearing strength of the bank portion 2b must be reinforced. For this purpose, anchor holes 4c and 5c are formed in the bank portion leads 4d and 5d, respectively, and are filled with a resin, thereby connecting the substrate portion 2a and bank portion 2b to each other. The diameter of the anchor holes 4c and 5c is 0.2 mm.

When the electronic component 20 with the hollow package structure constituted in this manner is to be mounted on a circuit board, the electronic component 20 is dipped in a solder bath so that the outer leads 4b and 5b are electrically connected to the conductor pattern (not shown) of the circuit board. At this time, the solder or a flux 10 may undesirably penetrate into the hollow package to fuse the bonding wires 6, and the electronic component 20 may accordingly malfunction. Alternatively, the solder or flux 10 may undesirably attach to the surface of the chip 3 to degrade the electrical characteristics of the chip 3, causing defective components. It was found that what allowed penetration of the solder or flux 10 was a gap 7 formed between the end of each of the lead members 4 and and the resin of the base 2, as shown in FIG. 8B.

The reason why the gap 7 is formed is as follows. When the lead members 4 and 5 are formed by etching, the ends of the lead members 4 and 5 that are not masked are etched excessively. When the lead members 4 and 5 are formed by press cutting, they are cut partly differently to form recessed portions 4g at the ends of the lead members 4 and 5. A depth α of the recessed portions 4g is as very small as about 10 μm to 30 μm. Since the resin particles of the epoxy resin that integrally molds the lead members 4 and 5 with the base 2 vary between 10 μm and 100 μm, if large particles happen to be sealed in the recessed portions 4g, the epoxy resin cannot completely fill the recessed portions 4g, but the gap 7 is formed.

In a package having a large outer shape, as in the conventional case, since the lead member portions covered with the resin are long, the probability of the resin with a small particle size to fill the gap increases, and the problem of solder penetration does not substantially occur. In contrast to this, an electronic component with a hollow package structure has a very small outer shape, and the width of its resin partition, i.e., the bank portion 2b, is as small as 0.35 mm. It is estimated that, in such an electronic component, the probability of the resin with a small particle size to fill the gap decreases, and that the gap 7 is formed with a high probability.

A technique that prevents the solder or flux 10 from penetrating into the package through the gap 7 between the lead members 4 and 5 and the sealing resin is not conventionally found, since there is substantially no probability of solder penetration. As a similar technical concept, a technique that prevents penetration of moisture is present, as shown in FIGS. 9 to 12. A case in which such a technical concept is applied to an electronic component having a hollow package structure will be described hereinafter.

FIGS. 9A and 9B show the main part of a semiconductor device as the first conventional example disclosed in Japanese Patent Laid-Open No. 2-14555. Referring to FIGS. 9A and 9B, waved portions 11 are formed on the two surfaces of a portion corresponding to a bank portion lead 4d of a lead member 4. With this arrangement, the adhesion between the bank portion lead 4d and the sealing resin is improved, thereby improving the moisture penetration resistance.

FIG. 10 shows the main part of an electronic component as the second conventional example disclosed in Japanese Patent Laid-Open No. 55-99755. Referring to FIG. 10, projections 12a and 12b are formed at two ends of a portion corresponding to a bank portion lead 4d of a lead member 4, in order to prevent the lead member 4 from being removed from the sealing resin. However, this reference has no description concerning penetration of the solder or moisture into the package.

FIG. 11 shows the main part of an electronic component as the third conventional example disclosed in Japanese Patent Laid-Open No. 2-78262. Referring to FIG. 11, a crank portion 13 is formed at a portion corresponding to a bank portion lead 4d of a lead member 4, so that the moisture resistance is improved.

FIG. 12 shows the main part of a semiconductor device as the fourth conventional example disclosed in Japanese Patent Laid-Open No. 5-226548. Referring to FIG. 12, an annular portion 14 having an anchor hole 4c is formed at a portion corresponding to a bank portion lead 4d of a lead member 4. Furthermore, the width of the annular portion 14 is made larger than that of the lead member 4, and the two edges of the annular portion 14 are made to project in an arcuated manner. With this arrangement, the mechanical impact applied to the lead member 4 during assembly is dispersedly absorbed, and the moisture penetrating into the package through the lead member 4 is blocked.

In the first conventional example described above, although penetration of the solder into the package from the two surfaces of the lead member 4 can be prevented, solder penetration from the two ends of the lead member 4 cannot be prevented. When this arrangement is applied to a compact hollow package, the waved portions 11 are formed to extend to a portion near the outer lead 4b. Accordingly, when the outer lead is bent, the stress is concentrated on the recessed portions, and the proximal portion of the outer lead can be easily broken.

In the second conventional example, the proportion of the area occupied by the bank portion lead 4d, including the projections 12a and 12b, to the area of the portion that connects a bank portion 2b and a substrate portion 2a becomes large, and the resin of the bank portion 2b corresponding to the bank portion lead 4d tends to peel off. As a result, if a foreign matter abuts against the cap or the outer lead is tried to be bent, a crack may be formed in the bank portion 2b or the bank portion 2b may be fractured. In this manner, when the projections 12a and 12b are formed on the bank portion lead 4d, the shearing strength of the bank portion 2b decreases.

In the third conventional example, a lead width β of the crank portion 13 formed in the bank portion lead 4d decreases, and the tensile strength of the lead member 4 decreases extremely. The reason for this is as follows. As described above, a high frequency hollow package has a very small outer shape and the width of its bank portion 2b is as small as 0.35 mm. A crank-like lead cannot be formed unless the lead width D of the crank portion 13 is set to be equal to or smaller than 0.05 mm. Also, since the lead member 4 becomes long more than necessary, its inductance increases to decrease the high frequency characteristics.

In the fourth conventional example, if the diameter of the anchor hole 4c of the annular portion 14 remains to be 0.2 mm, the effect of increasing the length of the moisture penetration path cannot be obtained unless a width W of the lead member 4 is set to be equal to or smaller than 0.2 mm. Then, the tensile strength of the lead member 4 decreases, and the high frequency characteristics degrade. On the contrary, if the width W of the lead member 4 remains to be 0.5 mm, the length of moisture penetration path cannot be increased unless the diameter of the anchor hole 4c is increased to about 0.5 mm and unless the diameter of the annular portion 14 is increased to about 1 mm. For this reason, the proportion of the area occupied by the annular portion 14 increases, and the shearing strength of the bank portion 2b decreases accordingly. As the width of the bank portion 2b is as small as 0.35 mm, the anchor hole 4c and bank portion lead 4d may extend beyond the bank portion 2b. In this case, the length of the moisture penetration path cannot be increased, resulting in a contradiction. Namely, the fourth conventional example can be applied to a large package but cannot be applied to a small package.

In this manner, even if the conventional technique for improving the moisture penetration resistance and that for improving the mechanical strength are to be applied to an electronic component having a hollow package structure, due to the extreme small size of the outer shape of the package, the mechanical strength of the hollow package decreases, and the high frequency characteristics of the electronic component degrade.

SUMMARY OF THE INVENTION

It is an object of the present invention to provide an electronic component which, even though it is sealed in a compact mold resin hollow package, maintains the mechanical strength of the package and the high frequency characteristics.

It is another object of the present invention to provide an electronic component which, even though it is sealed in a compact mold resin hollow package, prevents penetration of a solder or flux when it is to be mounted on a circuit board, so that the fraction defective of electronic components is lowered.

In order to achieve the above objects, according to the present invention, there is provided an electronic component comprising a substrate portion on which a chip is supported, a bank portion formed on a periphery of the substrate portion to surround the chip, a plurality of lead members made of conductive strip pieces and each having an inner lead electrically connected to the chip and an outer lead extending to an outside, the substrate portion and the bank portion being integrally molded with a resin to include the lead members so that the inner and outer leads are fixed to a connecting portion between the substrate portion and the bank portion, an anchor hole formed in a portion where each of the lead members is in contact with the bank portion, and filled with a resin, and at least a pair of notches formed in two ends of each of the lead members to sandwich the anchor hole.

BRIEF DESCRIPTION OF THE DRAWINGS

FIG. 2 is an enlarged plan view of the main part of the electronic component shown in FIG. 1A;

FIG. 3 is an enlarged plan view of the main part of an electronic component according to the second embodiment of the present invention;

DESCRIPTION OF THE PREFERRED EMBODIMENTS

The present invention will be described in detail with reference to the accompanying drawings.

[First Embodiment]

Figure 1A:
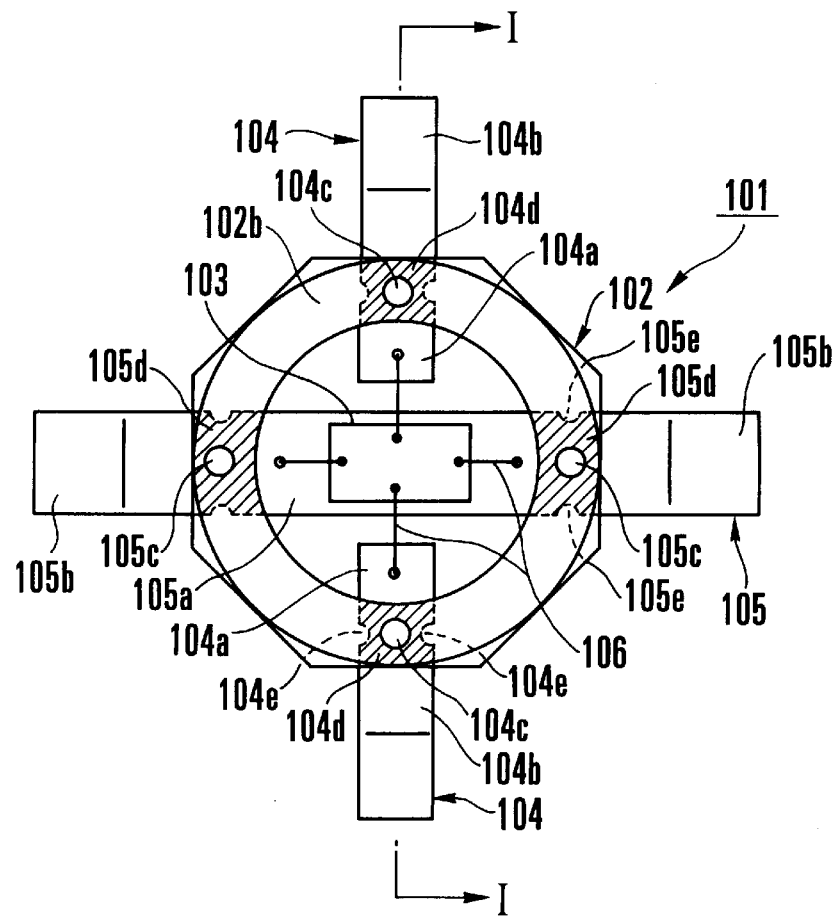
FIG. 1A is a plan view of an electronic component according to the first embodiment of the present invention from which a cap is removed.
Figure 1B:
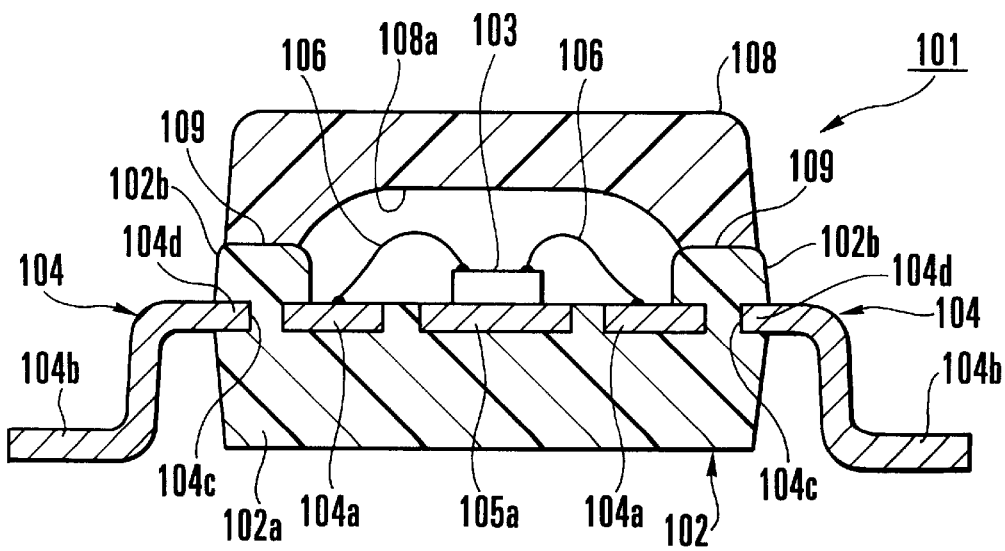
FIG. 1B is a sectional view of the electronic component taken along the line I—I of FIG. 1B on which the cap is placed.

FIG. 1A shows an electronic component according to the first embodiment of the present invention from which a cap is removed, FIG. 1B shows the electronic component shown in FIG. 1A on which the cap is placed, and FIG. 2 shows the main part of the electronic component shown in FIG. 1A.

Referring to FIG. 1A, an electronic component 101 is constituted by an octagonal base 102 on which lead members 104 and 105 made of conductive strip pieces and arranged crosswise are sealed with a resin, a cap 108 (FIG. 1B) adhered to the base 102, a chip 103 mounted on an island 105a constituted by the inner leads of the lead member 105, and bonding wires 106 for electrically connecting the chip 103 and lead members 104 and 105 to each other. The lead members 104 and 105 and the island 105a constitute a lead frame. The cap 108 is adhered to the base 102, thereby constituting a hollow package in which a space is formed between the chip 103 and cap 108.

The base 102 is integrally molded with the lead members 104 and 105 by loading the lead members 104 and 105, before the chip is mounted on them, in a sealing mold, and injecting an epoxy resin in the sealing mold and solidifying the epoxy resin. The main body of the base 102 forms a bottomed cylinder consisting of a substrate portion 102a and an annular bank portion 102b. The lead members 104 and 105 are fixed to the chip support surface of the substrate portion 102a. The bank portion 102b is annularly formed on the periphery of the substrate portion 102a to surround the chip support surface like a frame. The bank portion 102b functions such that, even if a mechanical stress is applied to the base 102, the resin will not peel off from the lead members 104 and 105.

Each lead member 104 is constituted by an inner lead 104a on its one end side which is accommodated in the package, a gull wing-like outer lead 104b on the other end side which extends to the outside of the package, and a bank portion lead 104d (indicated by crosshatched lines in FIG. 1A) for connecting the inner lead 104a and outer lead 104b to each other. The lead member 105 is constituted by the island 105a at the central portion accommodated in the package and serving also as the inner lead, a pair of gull wing-like outer leads 105b on the two end sides which extend outside the package, and bank portion leads 105d (indicated by crosshatched lines in FIG. 1A) for connecting the island 105a and outer leads 105b to each other. Namely, the lead member 105 connects the opposing inner leads 104a of the two lead members 104, thereby constituting the island 105a.

One lead member 105 is arranged on a line extending through the center of the base 102, and one pair of lead members 104 are arranged on a line extending through the center of the base 102 and perpendicularly intersecting the lead member 105. The lead members 104 and 105 are fixed on the base 102 as their bank portion leads 104d and 105d are sandwiched between the substrate portion 102a and bank portion 102b. One surface of the inner lead 105a of the lead member 105 serving also as the island, and one surface of the inner lead 104a of each lead member 104 are exposed to the inner bottom surface of the base 102, i.e., to the chip support surface of the substrate portion 102a, and the outer leads 104b and 105b radially extend outside the package.

The cap 108 is molded by injecting an epoxy resin in a sealing mold and solidifying the epoxy resin. The cap 108 has a recessed portion 108a to oppose the base 102, and the periphery of the recessed portion 108a is adhered to the upper surface of the bank portion 102b with an adhesive 109, as shown in FIG. 1B.

The characteristic feature of this high frequency hollow package resides in that its outer shape is very small. For example, an outer diameter D of the package is 2 mm, a width W of the lead members 104 and 105 is 0.5 mm, and the width of the bank portion 102b is 0.35 mm. Since the outer shape of the hollow package is very small in this manner, the shearing strength of the bank portion 102b must be reinforced. For this purpose, anchor holes 104c and 105c are formed in the bank portion leads 104d and 105d, respectively, and are filled with a resin, thereby connecting the substrate portion 102a and bank portion 102b to each other. The diameter of the anchor holes 104c and 105c is 0.2 mm.

Another characteristic feature of this embodiment resides in that a pair of semicircular notches 104e, and a pair of semicircular notches 105e are formed in portions of the lead members 104 and 105 where they are in contact with the bank portion 102b, i.e., in the two ends of the bank portion lead 104d or 105d, respectively. The notches 104e of the lead members 104 will be described. The notches 105e of the lead member 105 have the same function as that of the notches 104e, but their shape, size and position need not be the same as those of the notches 104e.

In this embodiment, each pair of semicircular notches 104e are formed in portions of each bank portion lead 104d such that they are axisymmetric with respect to the center line G—G of the width of the lead members 104 and are point-symmetric with respect to a center O of the anchor hole 104c, as shown in FIG. 2.

Since the notches 104e are formed in the bank portion leads 104d in this manner, the areas of portions where the bank portion 102b and substrate portion 102a are connected to each other increase. The shearing strength of the bank portion 102b increases accordingly. Even if a foreign matter abuts against the cap 108, a crack may not be formed in the bank portion 102b or the bank portion 102b may not be fractured.

Because of the presence of the notches 104e, the length of the penetration path of the solder or flux into the package can be increased on the two ends of each bank portion lead 104d, thereby preventing penetration of the solder or flux into the package. As the result of experiments, 17 defective components conventionally occurred out of 40 samples of the conventional electronic components, but no defective component occurred in the electronic components of this embodiment.

Since the notches 104e are semicircular, even if a tensile stress is applied to the lead member 104, the stress will not be concentrated on this portion, and a decrease in tensile strength can be prevented. Furthermore, the notches 104e are arranged to be axisymmetric with respect to the center line G—G of the width of the corresponding lead member 104 and to be point-symmetric with respect to the center O of the corresponding anchor hole 104c. When molding the base 102 with the sealing mold, even if this mold is slightly dislocated, the notches 104e of the bank portion lead 104d will not be exposed inside or outside the bank portion 102b.

[Second Embodiment]

FIG. 3 shows the main part of an electronic component according to the second embodiment of the present invention.

Referring to FIG. 3, a pair of notches 104e are axisymmetric with respect to a center line G—G of the width of a lead member 104, and both of the pair of notches 104e are formed at portions of a bank portion lead 104d shifted inward from a center O of an anchor hole 104c of the package by a length L in the longitudinal direction of the lead member 104. The positional relationship between the anchor hole 104c and notches 104e may be reversed, and the notches 104e may be arranged to be shifted outward from the center O of the anchor hole 104c of the package by a length L in the longitudinal direction of the lead member 104.

As the notches 104e are shifted from the center O of the anchor hole 104c by the length L in the longitudinal direction of the lead member 104 in this manner, a sufficiently large interval l can be maintained between the notches 104e and anchor hole 104c, so that a radius r of the notches 104e can be increased. Accordingly, the length of the penetration path of the solder or flux that tries to penetrate into the package at the two ends of the bank portion lead 104d can be increased, thereby reliably preventing penetration of the solder or flux into the package. When compared to the first embodiment described above, if the radius r of the notches 104e is set equal to that of first embodiment, since the interval l can be increased, a decrease in tensile strength of the lead member 104 due to the presence of the notches 104e or degradation in high frequency characteristics can be reduced.

[Third Embodiment]

Figure 4:
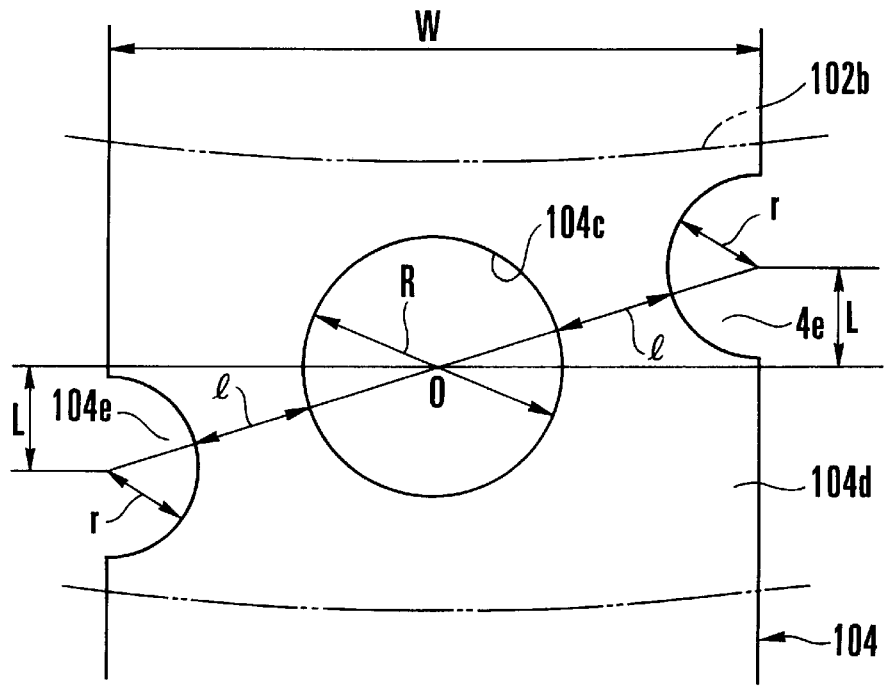
FIG. 4 is an enlarged plan view of the main part of an electronic component according to the third embodiment of the present invention.

FIG. 4 shows the main part of an electronic component according to the third embodiment of the present invention.

Referring to FIG. 4, a pair of notches 104e are shifted from a center O of an anchor hole 104c inward and outward, respectively, of the package by a length L, and are formed at portions of a bank portion lead 104d on a line extending through the center O of the anchor hole 104c. Accordingly, the notches 104e are arranged at positions point-symmetric with respect to the center O of the anchor hole 104c and not axisymmetric with respect to the center line of the width of the lead member 104.

In this third embodiment as well, since the notches 104e are arranged to be shifted from the center O of the anchor hole 104c in the longitudinal direction of the lead member 104, in the same manner as in the second embodiment described above, a radius r of the notches 104e can be increased. Therefore, the length of the penetration path of the solder or flux that tries to penetrate into the package at the two ends of the bank portion lead 104d can be further increased, and a sufficiently large interval l can be maintained between the anchor hole 104c and notches 104e.

Since the notches 104e are positioned on the line extending through the anchor hole 104c, the notches 104e will not oppose each other in the widthwise direction of the bank portion leads 104d, unlike in the second embodiment. As a result, a decrease in tensile strength of the lead members 104 or in high frequency characteristics can be minimized without decreasing the width of the bank portion lead 104d. In particular, in a package where a bank portion 102b can have a large width w, since notches 104e can be sufficiently separated from each other in the longitudinal direction of a lead member 104, the notches 104e will not oppose each other. Since the width of the bank portion lead 104d is not decreased from the both sides, a decrease in tensile strength or high frequency characteristics can be further reduced.

[Fourth Embodiment]

Figure 5:
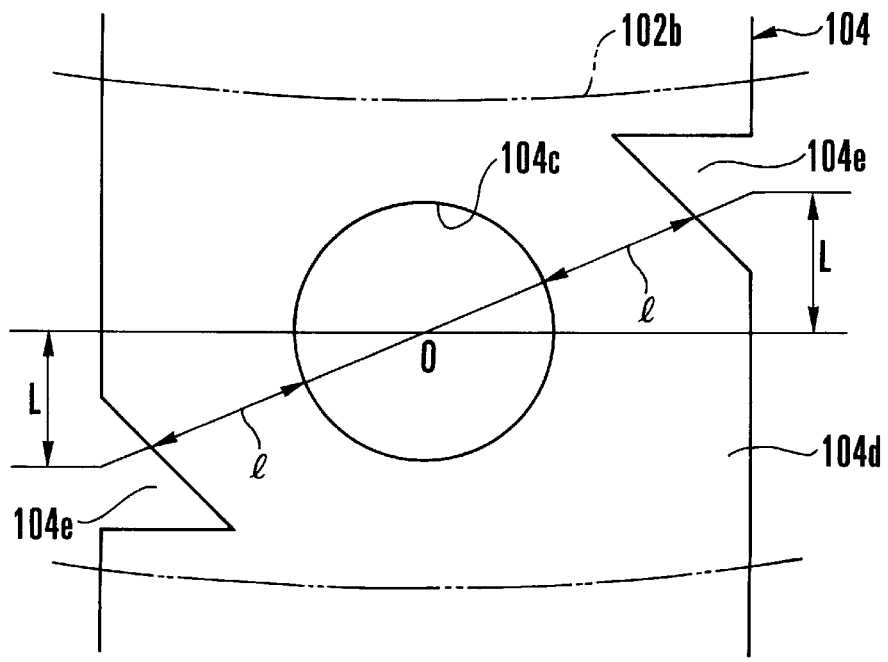
FIG. 5 is an enlarged plan view of the main part of an electronic component according to the fourth embodiment of the present invention.

FIG. 5 shows the main part of an electronic component according to the fourth embodiment of the present invention.

Referring to FIG. 5, a pair of notches 104e are formed triangularly. In this embodiment, the notches 104e are arranged at portions of the bank portion lead 104d identical to those shown in the third embodiment. However, the notches 104e may also be formed at portions identical to those shown in the first or second embodiment.

In the fourth embodiment, the notches 104e are arranged to be point-symmetric with respect to a center O of an anchor hole 104c, and are positioned to be shifted inward and outward from the center O of the anchor hole 104c of the package by a length L in the longitudinal direction of a lead member 104. With this arrangement, an interval l between the anchor hole 104c and notches 104e can be maintained to a value equal to or larger than a predetermined value, thereby increasing the length of the penetration path of the solder or flux. Since the penetration path of the solder or flux forms an acute angle, penetration of the solder or flux becomes further difficult.

[Fifth Embodiment]

Figure 6:
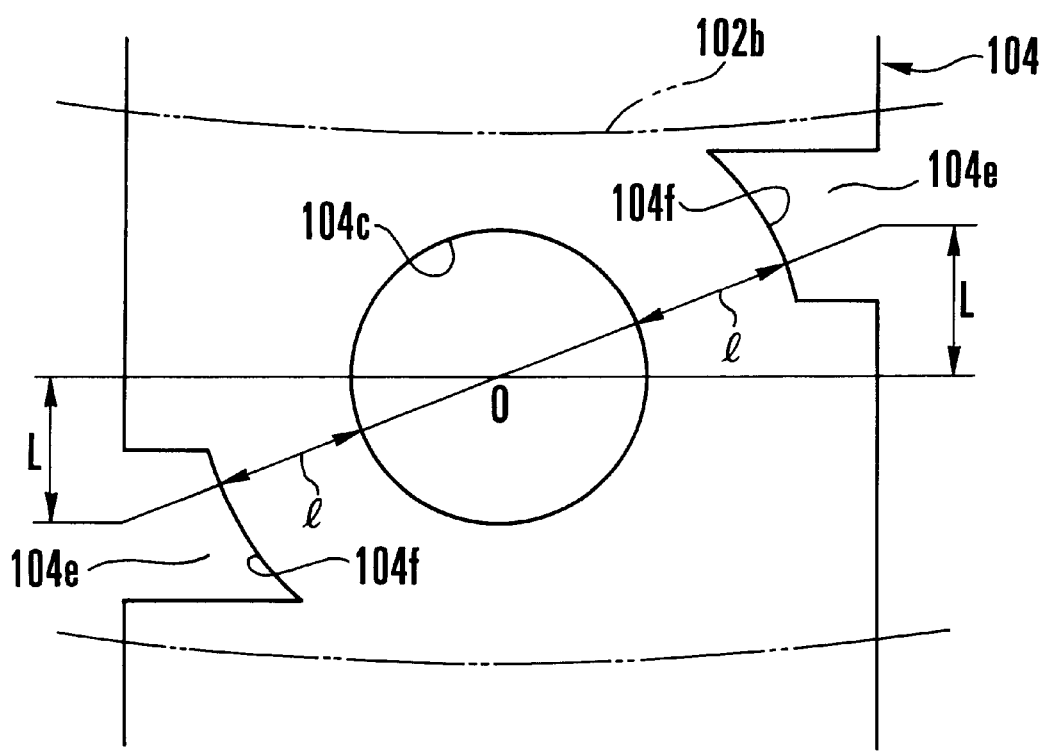
FIG. 6 is an enlarged plan view of the main part of an electronic component according to the fifth embodiment of the present invention.
Figure 7:
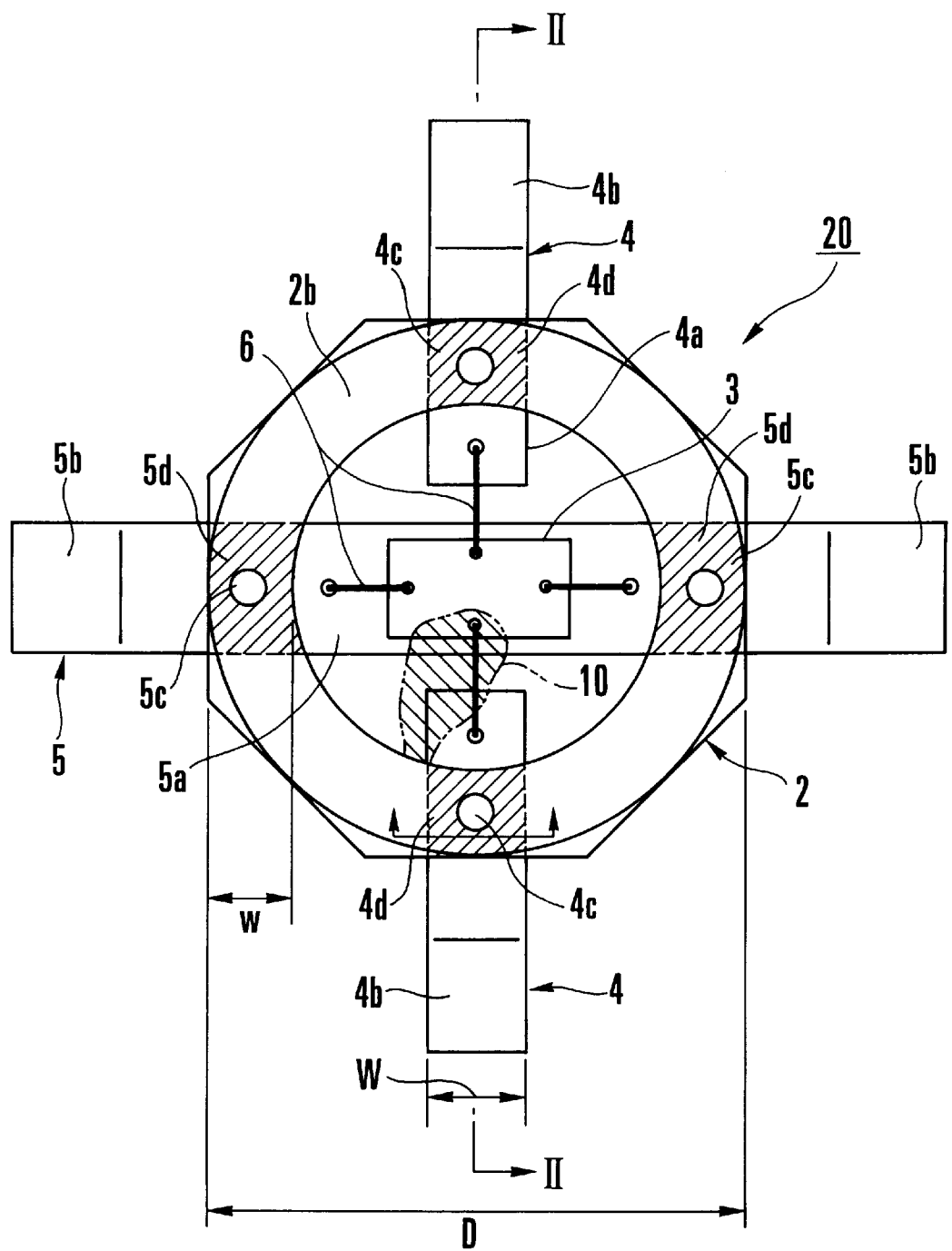
FIG. 7 is a plan view of a conventional electronic component from which the cap is removed.
Figure 8A:
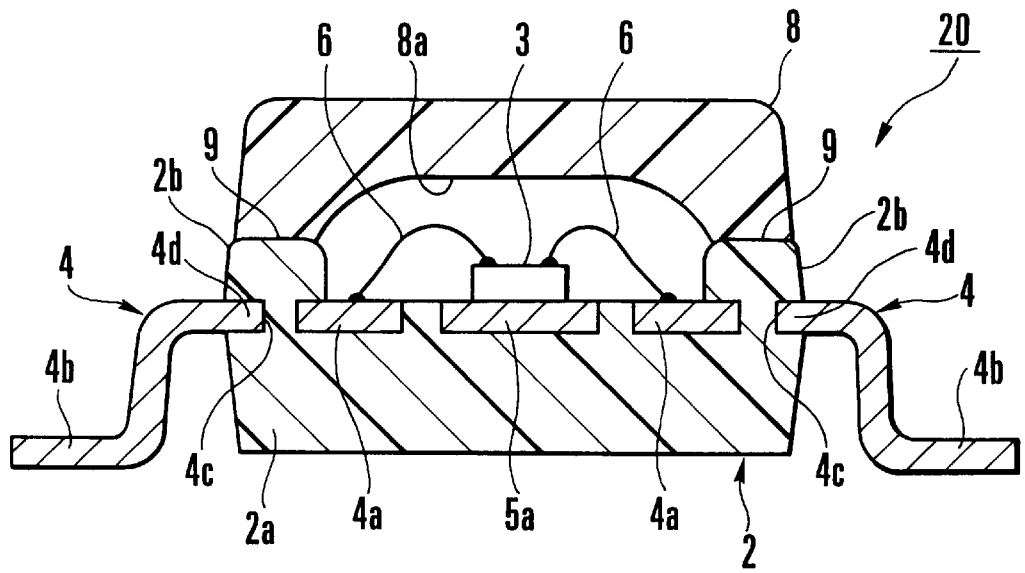
FIG. 8A is a sectional view of the conventional electronic component taken along the line II—II of FIG. 7 on which the cap is placed.
Figure 8B:
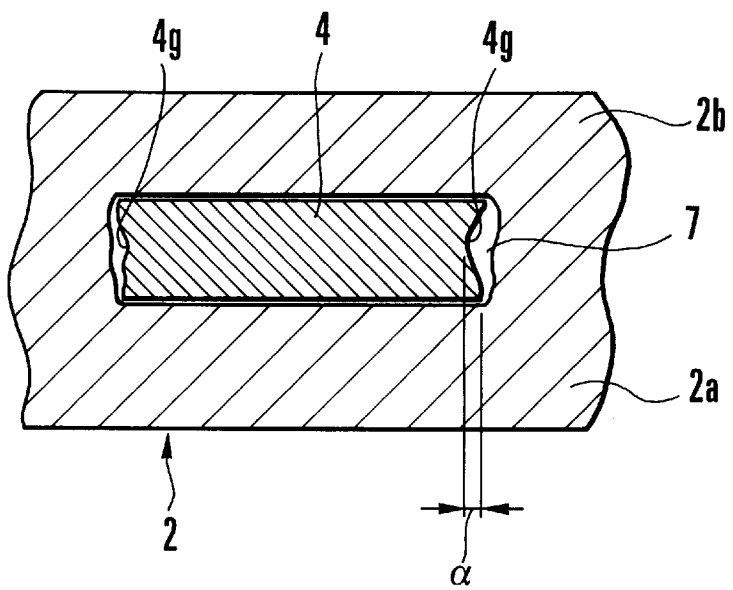
FIG. 8B is a sectional view of the conventional electronic component taken along the line III—III of FIG. 7.
Figure 9:
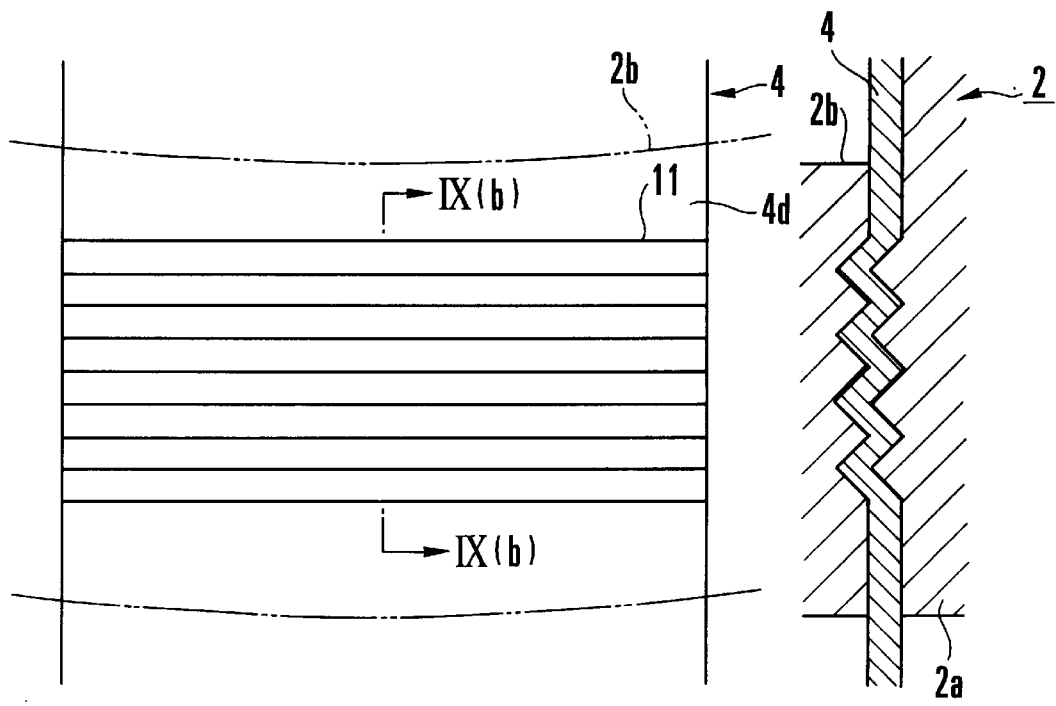
FIG. 9 is an enlarged plan view of the main part of an electronic component as the first conventional example.
Figure 10:
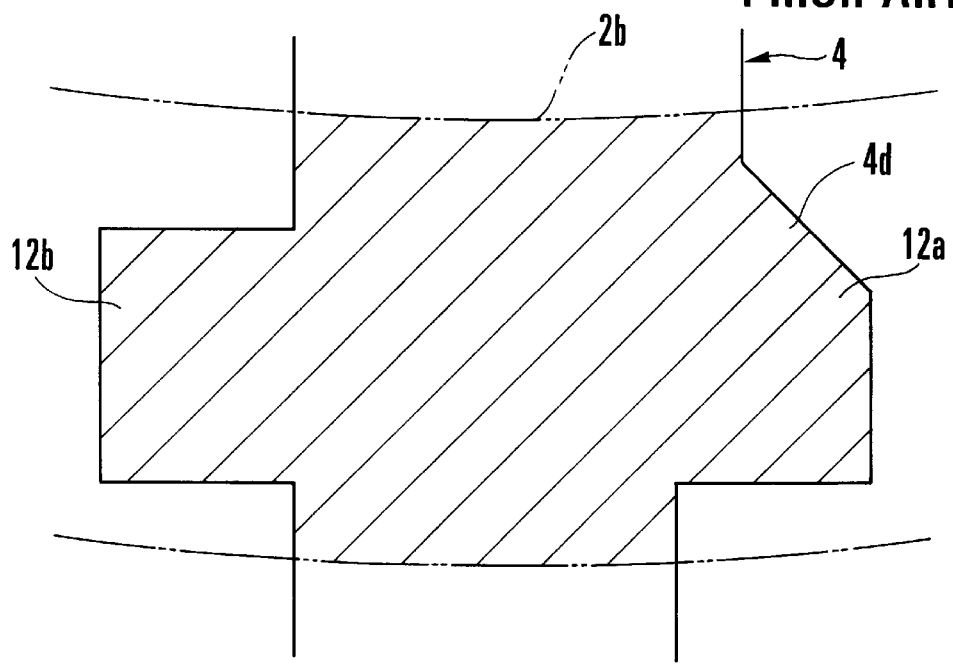
FIG. 10 is an enlarged plan view of the main part of an electronic component as the second conventional example.
Figure 11:
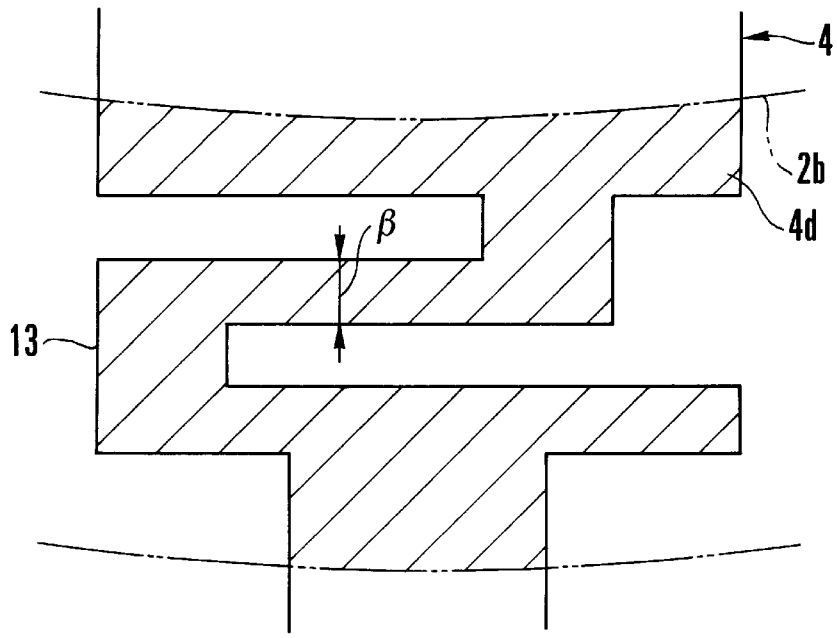
FIG. 11 is an enlarged plan view of the main part of an electronic component as the third conventional example.
Figure 12:
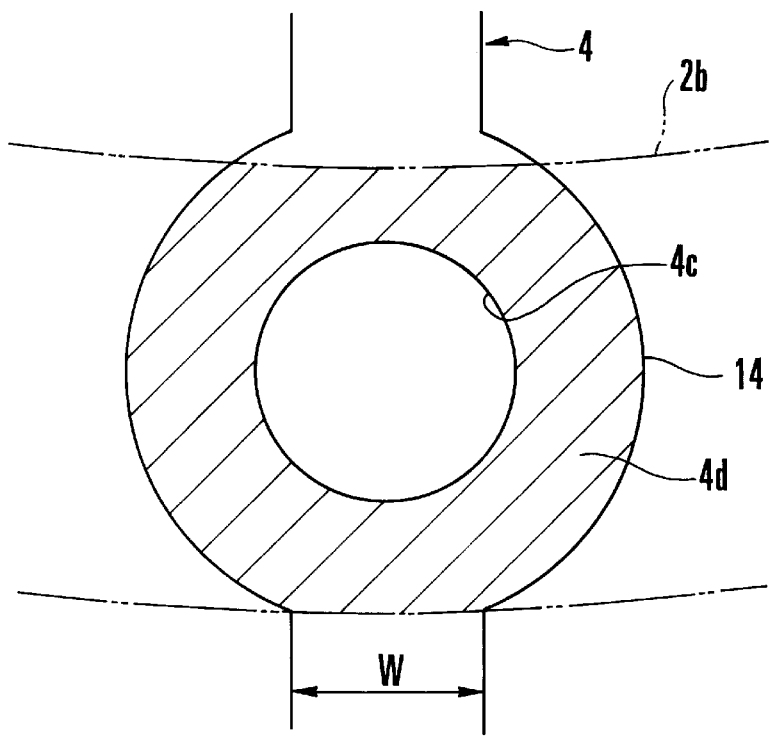
FIG. 12 is an enlarged plan view of the main part of an electronic component as the fourth conventional example.

FIG. 6 shows the main part of an electronic component according to the fifth embodiment of the present invention.

Referring to FIG. 6, a pair of notches 104e are formed rectangularly, or are formed such that one side 104f of each notch 104e which is closest to an anchor hole 104c is concentric with the anchor hole 104c. In FIG. 6, the notches 104e are arranged at portions of the bank portion lead 104d identical to those shown in the third embodiment. However, the notches 104e may be arranged at portions shown in the first or second embodiment.

In the fifth embodiment, the notches 104e are arranged to be point-symmetric with respect to a center O of the anchor hole 104c and are positioned to be shifted inward and outward from the center O of the anchor hole 104c of the package by a length L in the longitudinal direction of a lead member 104. With this arrangement, an interval l between the anchor hole 104c and notches 104e is maintained to a value equal to or larger than a predetermined value, so that the length of the penetration path of the solder or flux can form an acute angle and be further increased. As a result, penetration of the solder or flux becomes further more difficult.

In the first embodiment, as the lead member 104, e.g., a copper, a 42 alloy, or a stainless steel member having a thickness of 0.125 mm was used, and was formed to have a width W of 0.5 mm. A diameter R of the anchor hole 104c was 0.2 mm, and the radius r of the notches 104e was 0.05 mm. The lead member 104 had a width of 0.6 mm, and the radius r of the notches 104e in this case was 0.10 mm. As the sealing resin that formed the base 102 having the substrate portion 102a and bank portion 102b, an epoxy resin or bisphenol transparent resin was used.

As the result of experiments, it was confirmed that, in order to prevent solder penetration into the package, the depth r and width d of the notches 104e had to be equal to or larger than 0.05 mm and 0.1 mm, respectively. It was also confirmed that, in order to provide the bank portion 102b with a shearing strength equal to or larger than 4 kg, the radius R of the anchor hole 104c had to be equal to or larger than 0.2 mm. It was confirmed that, in order to provide the lead member 104 with a tensile strength equal to or larger than 2 kg, the minimum width W of the bank portion lead 104d, i.e., the sum of gaps l between the notches 104e and anchor hole 104c, had to be equal to or larger than 0.2 mm.

In the second embodiment, a width W of the lead member 104 was 0.5 mm, a diameter R of the anchor hole 104c was 0.2 mm, and the radius r of the lead member 104 was 0.07 mm. In this case, if the width W of the bank portion lead 104d is equal to or larger than 0.5 mm, the radius r of the notches 104e can also be set equal to or larger than 0.07 mm.

In the third embodiment, a width W of the lead member 104 was 0.5 mm, a radius R of the anchor hole 104c was 0.2 mm, and the radius r of the notches 104e was 0.07 mm. In this case, if the width W of the bank portion lead 104d is equal to or larger than 0.05 mm, the radius r of the notches 104e can be set equal to or larger than 0.07 mm.

In the respective embodiments described above, one notch 104e was formed in each of the two side ends of each bank portion lead 104d, leading to a total of two notches 104e in each bank portion lead 104d. However, a plurality of notches 104e can be formed at least in one side end, as a matter of course.

In the second to fifth embodiments described above, it is desirable that the notches 104e be not shifted inward or outward from the bank portion 102b of the package by a length equal to or larger than L to expose from the bank portion 102b. However, when aligning the sealing mold that molds the base 102, due to the poor positioning precision, the notches 104e are sometimes exposed from the bank portion 102b. In such a case, it is acceptable if the proportion of the exposed portion of the notches 104e is equal to or smaller than 50% the entire area of the notches 104e.

As the chip 103 constituting the electronic component, a semiconductor chip, e.g., a transistor, an FET, an IC, or a chip, e.g., an optical element, a surface acoustic wave element, or a resonator can be employed. The outer shape of the package is not limited to a circle but can be, e.g., a square. The number of lead members can be equal to or larger than four, as a matter of course. Furthermore, the present invention can similarly be applied to an electronic component on which a resin having a low dielectric constant is potted in place of the cap 108.

In the respective embodiments described above, penetration of the solder or flux into the package is prevented. When preventing penetration of moisture having a small molecular size, the surface of the package may be coated with a moisture-resistant film.

As has been described above, according to the present invention, the area of the connecting portion between the bank portion and substrate portion constituting the base can be increased. This increases the shearing strength of the bank portion. Even if a foreign matter abuts against the cap, a crack will not be formed in the bank portion, or the bank portion will not be fractured.

The length of the penetration path of the solder that tries to penetrate into the package from the bank portion lead can be increased. Even if the package is a compact hollow one, penetration of the solder or flux into the package is prevented, and the fraction defective of components in the soldering step can be greatly lowered.

Since the side end portions of the bank portion lead are not formed straight, the penetration speed of the solder or flux can be decreased. As a result, the amount of solder or flux penetrating into the package can be greatly decreased, and the occurrence of defective components can be reliably prevented.

The notches are arranged to be point-symmetric with respect to the center of the anchor hole and axisymmetric with respect to the center line of the width of the lead member. When molding the base with the sealing mold, even if the mold is slightly dislocated, the notches in the lead member will not be exposed inside or outside the bank portion.

Since the notches are shifted to separate from the anchor hole in the longitudinal direction of the lead member and the size of the notches is increased, the length of the penetration path of the solder or flux that tries to penetrate into the package at the two ends of the bank portion lead can be increased, thereby preventing penetration into the package more reliably. Since the interval between the notches and anchor hole is maintained sufficiently large, the tensile strength of the lead member is not decreased.

Since the notches are positioned on the line extending through the center of the anchor hole, the pair of notches will not oppose each other to decrease the width of the bank portion lead. Therefore, a decrease in tensile strength of the lead member and in high frequency characteristics can be minimized.

Since the notches are formed semicircular, even if a tensile stress is applied to the lead member, the stress will not be concentrated, so that a decrease in tensile strength can be prevented. Since the notches are formed triangular, the penetration path of the solder or flux forms an acute angle, making solder penetration further difficult. Since the notches are formed square, the gap between the notches and anchor hole is maintained to be equal to or larger than a predetermined value, further increasing the length of the penetration path of the solder or flux.

What is claimed is:

1. An electronic component comprising:
   a substrate portion with a central portion on which a chip is to be supported;
   a bank portion formed on a periphery of said substrate portion to surround said central portion;
   a plurality of lead members made of conductive strip pieces and each having an inner lead for being electrically connected to the chip and an outer lead extending to an outside, said substrate portion and said bank portion being integrally molded with a resin to include said lead members so that said inner and outer leads are fixed to a connecting portion between said substrate portion and said bank portion;

an anchor hole formed in a portion where each of said lead members is in contact with said bank portion, and filled with a resin; and at least a pair of notches of identical shape in two longitudinal edges of each of said lead members to sandwich said anchor hole, said notches being in the portion where each of said lead members contacts said bank portion and being symmetrical about one of a center line of a width of a corresponding one of said lead members and a center of said anchor hole.

2. An electronic component according to claim 1, wherein said notches are arranged at positions point-symmetric with respect to the center of said anchor hole and axisymmetric with respect to the center line of the corresponding one of said lead members.

3. An electronic component according to claim 1, wherein said notches are arranged at positions axisymmetric with respect to the center line of the corresponding one of said lead members, separated from said anchor hole in a longitudinal direction of said lead member, and not to be exposed from said bank portion.

4. An electronic component according to claim 3, wherein said notches are arranged at positions shifted inward from said anchor hole of said bank portion.

5. An electronic component according to claim 3, wherein said notches are arranged at positions shifted outward from said anchor hole of said bank portion.

6. An electronic component according to claim 1, wherein said notches are arranged at positions point-symmetric with respect to the center of said anchor hole and not axisymmetric with respect to the center line of the corresponding one of said lead members.

7. An electronic component according to claim 1, wherein said notches have one shape selected from a semicircle, a square, and a triangle.

8. An electronic component according to claim 1, further comprising an island which is fixed at a center of said substrate portion and on which the chip is to be mounted, and wherein said lead members and said island constitute a lead frame.

9. An electronic component according to claim 8, wherein said island is constituted by connecting said inner leads of a pair of said lead members that are arranged to oppose each other on a line extending through a center of said substrate portion.

10. An electronic component according to claim 1, further comprising a cap having a recessed portion, and wherein a periphery of said recessed portion is adhered to an upper surface of said bank portion, thereby constituting a hollow package that seals said chip with said substrate portion, said bank portion, and said cap.

11. A package for an electronic component, comprising:

a substrate having a central portion for supporting an electronic component;

a plurality of leads extending from the central portion to an exterior of the package across a periphery of said substrate;

a bank portion attached to the periphery of said substrate, each of said leads having a held portion that is encased by said bank portion and the periphery of said substrate and is held thereby;

each of said leads comprising an anchor hole that is entirely within said held portion and through which said bank portion and the periphery directly contact each other; and each of said leads further comprising a pair of notches in opposite longitudinal edges thereof adjacent said anchor hole and entirely within said held portion, each notch in each said pair of notches being the same shape and positioned so that each said pair of notches is symmetrical about one of a longitudinal axis of the respective lead and a center of the respective anchor hole.

12. The package of claim 11, wherein each of said notches is triangular.

13. The package of claim 11, wherein each of said notches is generally rectangular with one concave side.

14. The package of claim 11, wherein each of said notches is semicircular.

15. The package of claim 14, wherein said pair of semicircular notches are symmetrical about both the longitudinal axis of the respective lead and the center of the respective anchor hole.

16. The package of claim 14, wherein said pair of semicircular notches are symmetrical about the longitudinal axis of the respective lead.

17. The package of claim 14, wherein said pair of semicircular notches are symmetrical about the center of the respective anchor hole.

18. The package of claim 14, wherein both semicircular notches in said pair of semicircular notches are spaced the same distance from said anchor hole.

19. The package of claim 11, wherein the periphery is an annular ring around the central portion and said bank portion is a round ring corresponding to said annular ring.

20. A package for an electronic component comprising plural leads extending between an inside and an outside of the package, the leads each having a portion encased in a resin package material, wherein the encased portion of each lead comprises two lead bridges of equal width connecting two lead segments that are each wider than a combined width of said two bridges, each of said two bridges having semicircular concave sides.

* * * * *